(12) United States Patent
Ikeda et al.

(10) Patent No.: US 10,122,394 B2
(45) Date of Patent: Nov. 6, 2018

(54) ATTACHMENT STRUCTURE FOR ELECTRONIC COMPONENT ACCOMMODATION BOX

(71) Applicant: Yazaki Corporation, Tokyo (JP)

(72) Inventors: Naoyuki Ikeda, Shizuoka (JP); Toshitaka Iwasaki, Shizuoka (JP); Hiroki Kayamori, Shizuoka (JP); Takao Murakami, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 15/615,381

(22) Filed: Jun. 6, 2017

(65) Prior Publication Data

US 2017/0359093 A1  Dec. 14, 2017

(30) Foreign Application Priority Data

Jun. 9, 2016 (JP) ................................. 2016-115225

(51) Int. Cl.
| | |
|---|---|
| *H04B 1/06* | (2006.01) |
| *B60R 16/023* | (2006.01) |
| *B60R 11/00* | (2006.01) |
| *H04B 1/08* | (2006.01) |

(52) U.S. Cl.
CPC .......... *H04B 1/082* (2013.01); *B60R 16/0238* (2013.01); *B60R 2011/0042* (2013.01); *B60R 2011/0094* (2013.01); *H01L 2224/15* (2013.01)

(58) Field of Classification Search
None
See application file for complete search history.

(56) References Cited

U.S. PATENT DOCUMENTS

| | | | | |
|---|---|---|---|---|
| 4,281,938 A | * | 8/1981 | Phillips ................... | B41J 25/24 400/144.2 |
| 5,723,798 A | * | 3/1998 | Cole ....................... | G01M 7/08 29/829 |
| 5,730,429 A | | 3/1998 | Ivers et al. | |

(Continued)

FOREIGN PATENT DOCUMENTS

| | | |
|---|---|---|
| JP | 3-22142 U | 3/1991 |
| JP | 3-66877 A | 3/1991 |

(Continued)

OTHER PUBLICATIONS

Japanese Office Action for the related Japanese Patent Application No. 2016-115225 dated Jun. 5, 2018.

*Primary Examiner* — Dimary Lopez Cruz
*Assistant Examiner* — Muhammed Azam
(74) *Attorney, Agent, or Firm* — Kenealy Vaidya LLP (57) ABSTRACT

An attachment structure for an electronic component accommodation box including a vibration proof structure includes a damping structure between a vehicle body side attachment member and a casing in which at least one electronic component is mounted. The damping structure includes first sliding portions, second sliding portions, and damping members interposed between the first sliding portions and the second sliding portions. The damping members generate sliding resistance between each of the first sliding portions and each of the second sliding portions when the casing moves relative to the vehicle body side attachment member.

4 Claims, 4 Drawing Sheets

(56) References Cited

U.S. PATENT DOCUMENTS

| | | | | |
|---|---|---|---|---|
| 5,741,313 | A * | 4/1998 | Davis | A61N 1/375 |
| | | | | 607/36 |
| 5,973,923 | A * | 10/1999 | Jitaru | H01F 27/06 |
| | | | | 165/185 |
| 6,380,728 | B1 * | 4/2002 | Tareilus | H01R 31/00 |
| | | | | 324/117 H |
| 7,375,974 | B2 * | 5/2008 | Kirigaya | H05K 1/0203 |
| | | | | 174/520 |
| 7,428,156 | B2 * | 9/2008 | Knappich | B60R 11/0258 |
| | | | | 361/807 |
| 8,941,017 | B2 * | 1/2015 | Nagano | H03H 9/1021 |
| | | | | 174/50.5 |
| 2002/0179385 | A1 * | 12/2002 | Tryggvason | F16F 15/02 |
| | | | | 188/266.1 |
| 2002/0179807 | A1 * | 12/2002 | Jitsukawa | G11B 33/08 |
| | | | | 248/638 |
| 2013/0157865 | A1 * | 6/2013 | Shen | G01R 33/3804 |
| | | | | 505/162 |
| 2014/0063469 | A1 | 3/2014 | Folcik et al. | |

FOREIGN PATENT DOCUMENTS

| | | |
|---|---|---|
| JP | 2013-223387 A | 10/2013 |
| JP | 2015-225260 A | 12/2015 |
| JP | 2017-122506 A | 7/2017 |

\* cited by examiner

ATTACHMENT STRUCTURE FOR ELECTRONIC COMPONENT ACCOMMODATION BOX

CROSS-REFERENCE TO RELATED APPLICATION(S)

The present application claims priority to and incorporates by reference the entire contents of Japanese Patent Application No. 2016-115225 filed in Japan on Jun. 9, 2016.

BACKGROUND OF THE INVENTION

1. Field of the Invention

The present invention relates to an attachment structure for an electronic component accommodation box.

2. Description of the Related Art

In a hybrid vehicle equipped with a hybrid system, an electronic component accommodation box such as a junction box including a high voltage relay is mounted to a position close to a battery module. The high voltage relay generates vibration during on-off switching in a switching control. The generated vibration is transmitted to a vehicle interior through a vehicle body and a casing of the electronic component accommodation box. Thus, when a passenger hears this vibration as an operation sound, there is concern that the passenger may feel uncomfortable. Here, in a conventional electronic component accommodation box, there is known a method in which a vibration proof structure is provided between a casing and a vehicle body to suppress the vibration generated by the operation of the high voltage relay from being transmitted from the casing to the vehicle body and to suppress a passenger from hearing an operation sound.

For example, as the vibration proof structure of the electronic component accommodation box with respect to the vehicle body, Japanese Patent Application Laid-Open No. 2013-223387 discloses vibration damping rubber which is an elastic body provided between the vehicle body and the casing of the electronic component accommodation box. Since the vibration damping rubber is interposed between the electronic component accommodation box and the vehicle body, it is possible to suppress the vibration of the electronic component accommodation box from being transmitted to the vehicle body.

Since the vibration proof structure is interposed between the electronic component accommodation box and the vehicle body in this kind of electronic component accommodation box, a relative movement of the electronic component accommodation box to the vehicle body is allowed. Since the electronic component accommodation box moves relative to the vehicle body, there is a possibility that the electronic component such as the high voltage relay mounted in the electronic component accommodation box is adversely influenced.

SUMMARY OF THE INVENTION

The present invention has been made in view of the above-described circumstances and an object of the present invention is to provide an attachment structure for an electronic component accommodation box capable of suppressing a bad influence on an electronic component mounted in an electronic component accommodation box.

In order to achieve the above mentioned object, an attachment structure for an electronic component accommodation box according to one aspect of the present invention includes a casing of an electronic component accommodation box in which at least one electronic component is mounted, a vehicle body side attachment member on which the casing is provided, a vibration proof structure provided between the casing and the vehicle body side attachment member, and a damping structure provided between the casing and the vehicle body side attachment member and different from the vibration proof structure, wherein the vibration proof structure includes an elastic vibration proof member, the vibration proof member is attached to the casing and supports a load of the casing with respect to the vehicle body side attachment member, the damping structure includes a first sliding portion, a second sliding portion, and a damping member interposed between the first sliding portion and the second sliding portion, and the damping member generates sliding resistance between the first sliding portion and the second sliding portion when the casing moves relative to the vehicle body side attachment member.

According to another aspect of the present invention, in the attachment structure for an electronic component accommodation box, the first sliding portion may be a sliding hole, the second sliding portion may be a sliding pin, the damping member may be attached along an inner peripheral surface of the sliding hole, the sliding pin may be inserted into the sliding hole provided with the damping member, and an outer peripheral surface of the sliding pin may be in contact with the damping member to generate sliding resistance during the relative movement.

According to still another aspect of the present invention, in the attachment structure for an electronic component accommodation box, the damping member may be an elastic rubber damper.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

An embodiment of an attachment structure for an electronic component accommodation box according to the present invention will be described hereinafter in detail with reference to the accompanying drawings. Note that the present invention is not limited to the embodiment. Furthermore, components in the following embodiment include components which can be easily assumed by those skilled in the art or the substantially same components. In addition, various omissions, replacements, and modifications can be made to the components in the following embodiment within the scope not deviating from the gist of the present invention.

Embodiment

Figure 1:
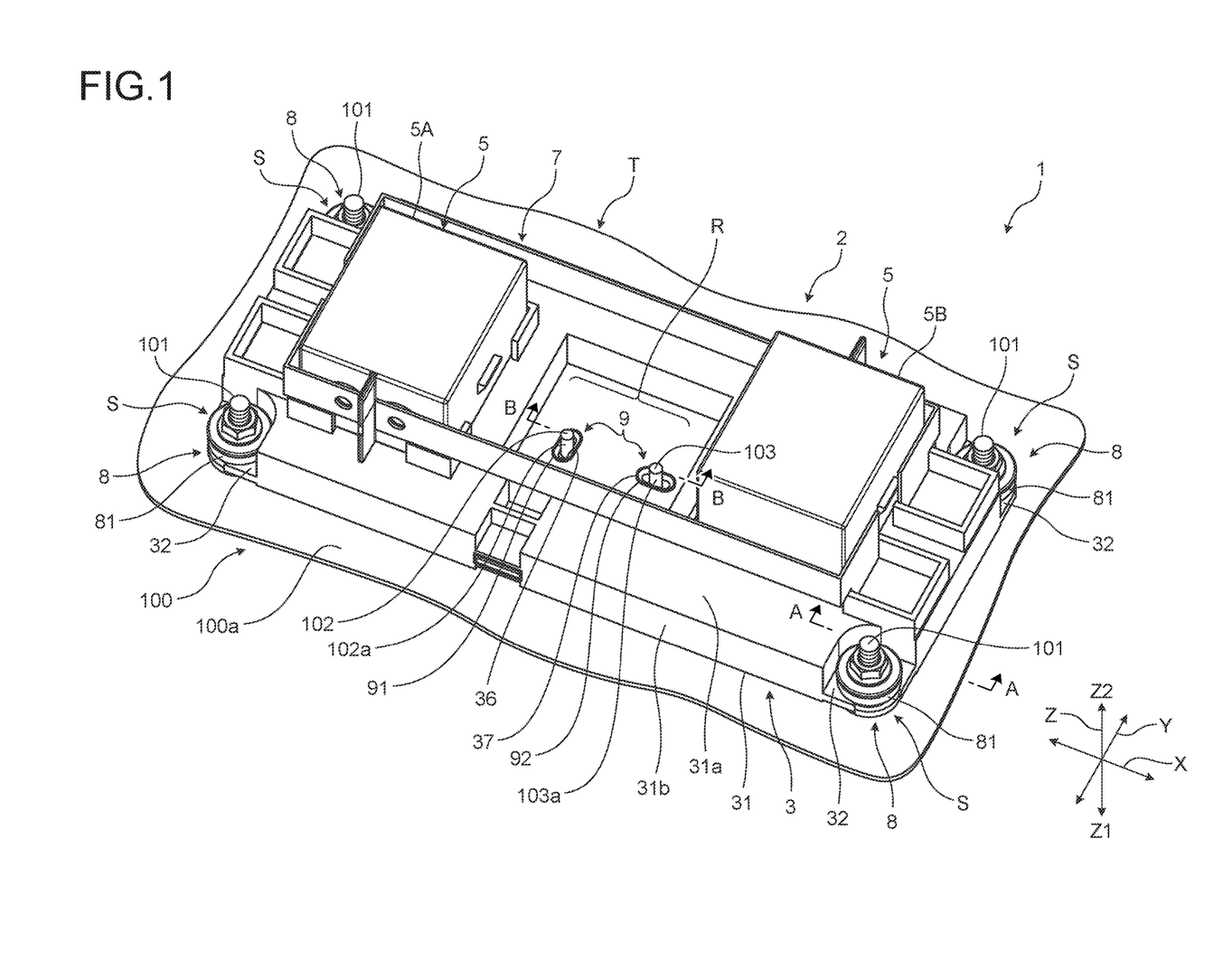
FIG. 1 is a perspective view of an electronic component accommodation box according to an embodiment.
Figure 2:
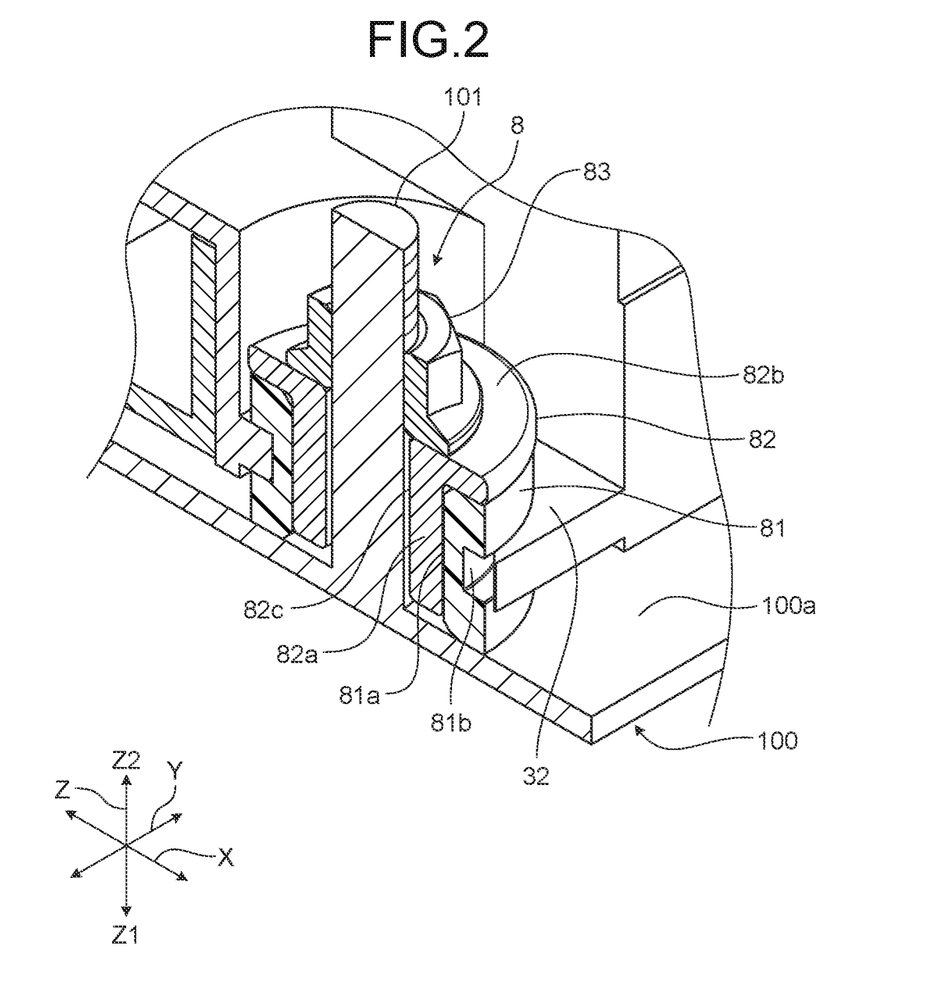
FIG. 2 is a partially cross-sectional perspective view of the electronic component accommodation box according to the embodiment.
Figure 3:
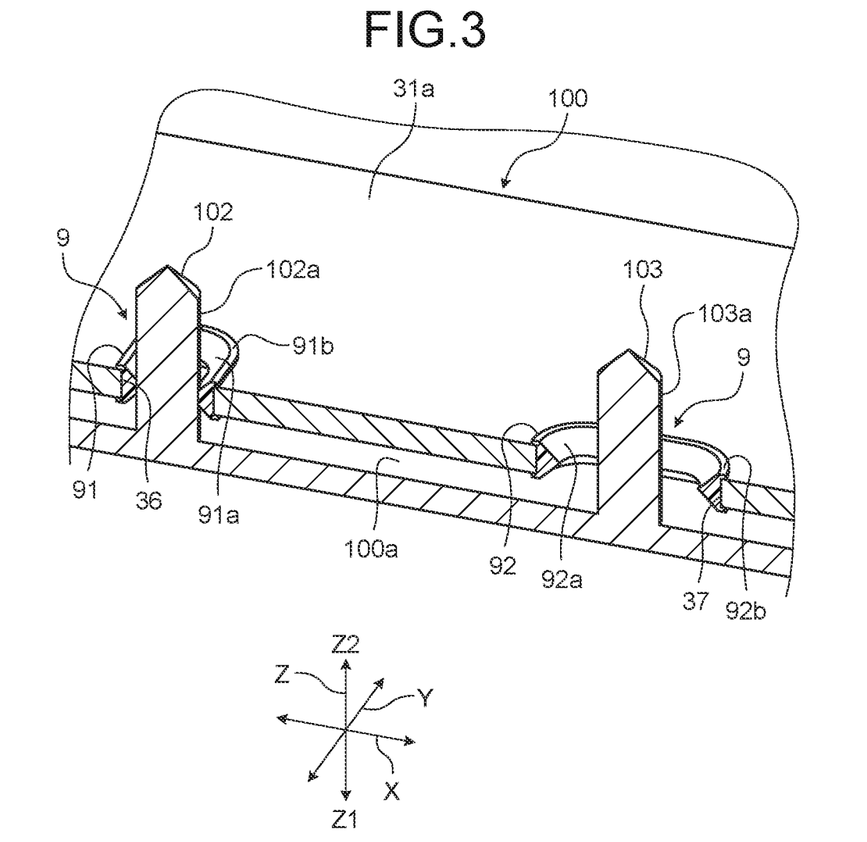
FIG. 3 is a partially cross-sectional perspective view of the electronic component accommodation box according to the embodiment.
Figure 4:
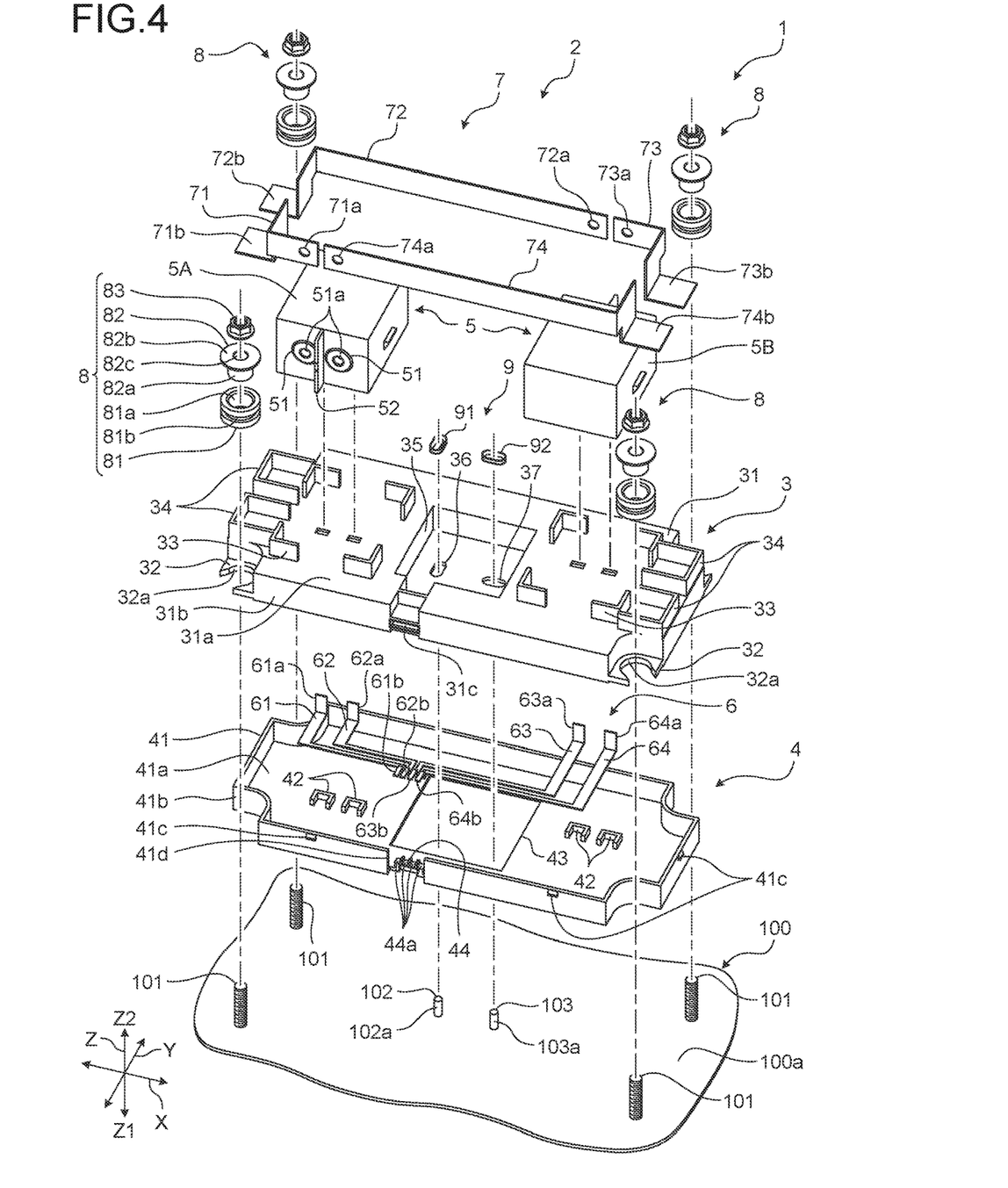
FIG. 4 is an exploded perspective view of the electronic component accommodation box according to the embodiment.

First, an electronic component accommodation box according to an embodiment will be described. FIG. 1 is a perspective view of the electronic component accommodation box according to the embodiment. FIG. 2 is a partially cross-sectional perspective view of the electronic component accommodation box according to the embodiment. FIG. 3 is a partially cross-sectional perspective view of the electronic component accommodation box according to the embodiment. FIG. 4 is an exploded perspective view of the electronic component accommodation box according to the embodiment. Here, FIGS. 1 and 4 are diagrams illustrating a state where an upper cover of a casing is separated, FIG. 2 is a cross-sectional view taken along a line A-A of FIG. 1, and FIG. 3 is a cross-sectional view taken along a line B-B of FIG. 1. Further, an X direction of the drawings is a width direction of the electronic component accommodation box of the embodiment. A Y direction is a depth direction of the electronic component accommodation box of the embodiment and is a direction orthogonal to the width direction. A Z direction is a vertical direction of the electronic component accommodation box of the embodiment and is a direction orthogonal to the width direction and the depth direction. A Z1 direction is an assembly direction of the electronic component accommodation box with respect to a vehicle body and is a downward direction. A Z2 direction is a direction opposite to the Z1 direction and is an upward direction.

The electronic component accommodation box 1 of the embodiment is installed close to a battery module (not illustrated), for example, and is configured to connect a power supply to an inverter or various electronic devices mounted inside a vehicle. The electronic component accommodation box 1 is configured to store various electronic components and is an electrical connection box such as a junction box in the embodiment. As illustrated in FIGS. 1 and 4, the electronic component accommodation box 1 is attached to a vehicle body side attachment member 100 to be attached to a vehicle body and includes a casing 2, a casing body 3, a lower cover 4, an upper cover (not illustrated), an electronic component 5, a first busbar 6, a second busbar 7, a vibration damping unit 8, and a damping member 9.

As illustrated in FIG. 1, the electronic component accommodation box 1 is attached to the vehicle body side attachment member 100 by an attachment structure T. The attachment structure T includes a vibration proof structure S and a damping structure R.

Here, the vehicle body side attachment member 100 is configured to install the casing 2 and is, for example, a panel constituting a vehicle body such as a metal plate below a sheet provided with an electronic module. The vehicle body side attachment member 100 includes a casing installation surface 100a to which the electronic component accommodation box 1 is attached, that is, in which the casing 2 is installed. In the vehicle body side attachment member 100, the casing installation surface 100a is provided with a plurality of fixed pins 101, a first sliding pin 102, and a second sliding pin 103.

The fixed pins 101 constitute a part of the vibration proof structure S. The fixed pins 101 protrude from positions facing four corners of the casing 2 when viewed from the Z direction in the casing installation surface 100a and extend in the Z2 direction. The fixed pin 101 has a columnar shape and an outer peripheral surface thereof is provided with a male screw.

The first sliding pin 102 and the second sliding pin 103 constitute a part of the damping structure R and correspond to second sliding portions. The sliding pins 102 and 103 protrude from the substantially center portion of an area (a rectangular area) surrounded by the fixed pins 101 when viewed from the Z direction in the casing installation surface 100a, extend in the Z2 direction, and are arranged in the X direction. The sliding pins 102 and 103 are formed in a tapered cylindrical shape to be respectively easily inserted into a first sliding hole 36 and a second sliding hole 37 of the casing 2.

The casing 2 is formed of insulating synthetic resin or the like, includes the casing body 3, the lower cover 4, and the upper cover as illustrated in FIG. 4, and at least one electronic component 5 is mounted in the casing 2.

The casing body 3 is configured to store the electronic component 5, the first busbar 6, and the vibration damping unit 8. The casing body 3 includes a body portion 31, a plurality of claw portions 32, a relay storage portion 33, a second busbar storage portion 34, and a concave portion 35.

The body portion 31 is a substantially rectangular box-shaped member in which the X direction corresponds to a longitudinal direction when viewed from the Z direction and a lower surface in the Z direction is provided with an opening portion (not illustrated) and an inner space portion. The body portion 31 is formed so that four corner portions having a rectangular shape when viewed from the Z direction are notched in a substantially circular-arc shape. The body portion 31 includes a storage surface 31a and a side wall 31b. The storage surface 31a is a top surface of the body portion 31. The side wall 31b extends in the Z1 direction along the outer periphery of the storage surface 31a when viewed from the Z direction. The side wall 31b is provided with a plurality of locking portions (not illustrated). The side wall 31b is provided with a penetration hole 31c which penetrates the side wall 31b in the Y direction so that the inner space portion of the casing body 3 communicates with the outside of the casing body 3. The penetration hole 31c is formed in a rectangular shape when viewed from the Y direction and is formed in a size in which external terminal connection portions 61b, 62b, 63b, and 64b of the first busbar 6, described later can be protruded outward from the inner space portion.

The claw portion 32 constitutes a part of the vibration proof structure S and is configured to mount an elastic vibration proof member (a rubber mount) 81, described later thereon. The claw portion 32 protrudes outward from the side wall 31b at each corner portion of the casing body 3 when viewed from the Z direction. The claw portion 32 is provided with a notch portion 32a which is notched in a U-shape from an external end portion toward the side wall 31b. The notch portion 32a is configured to insert a groove portion 81b of the rubber mount 81, described later thereinto.

The relay storage portion 33 is configured to individually store the electronic component 5. In the relay storage portion 33, a storage space portion is formed by a storage wall portion protruding from the storage surface 31a and the electronic component 5 is inserted into the storage space portion. The storage surface 31a constituting the storage space portion is provided with a plurality of relay terminal penetration holes through which the relay terminal of the electronic component 5 passes. The relay storage portions 33 of the embodiment are formed to face each other across the concave portion 35 of the body portion 31 in the X direction.

The second busbar storage portion 34 is configured to individually store each of foot portions 71b, 72b, 73b, and 74b of the second busbar 7, described later. In the second busbar storage portion 34, a storage space portion is formed by a storage wall portion protruding from the storage surface 31a and the foot portions 71b, 72b, 73b, and 74b are inserted into the storage space portion. The second busbar storage portions 34 of the embodiment are arranged in the Y direction at the opposite side to the concave portion 35 of each relay storage portion 33 in the X direction.

The concave portion 35 is formed to be recessed in the Z1 direction between the relay storage portions 33 on the storage surface 31a. The concave portion 35 is formed in a substantially square shape when viewed from the Z direction. The concave portion 35 is provided with the first sliding hole 36 and the second sliding hole 37.

The first sliding hole 36 constitutes a part of the damping structure R and is a first sliding portion. The first sliding hole 36 is a penetration hole which penetrates the body portion 31 in the Z direction from the storage surface 31a and the first sliding pin 102 is inserted thereinto. The first sliding hole 36 is formed in an elongated hole shape having facing longitudinal edges in the Y direction. The first sliding hole 36 is formed in a size in which facing longitudinal edges come in contact with the first sliding pin 102 while the damping member 9 is attached thereto.

The second sliding hole 37 constitutes a part of the damping structure R and is the first sliding portion. The second sliding hole 37 is a penetration hole which penetrates the body portion 31 in the Z direction from the storage surface 31a and is used to insert the second sliding pin 103 thereinto. The second sliding hole 37 is formed in an elongated hole shape having facing longitudinal edges in the X direction. The second sliding hole 37 is formed in a size in which facing longitudinal edges come in contact with the second sliding pin 103 while the damping member 9 is attached thereto.

The lower cover 4 is configured to store the first busbar 6. The lower cover 4 includes a body portion 41, a first busbar storage portion 42, an opening portion 43, and a terminal holding portion 44.

The body portion 41 is a substantially rectangular dish-shaped member in which the X direction becomes a longitudinal direction when viewed from the Z direction and a top surface thereof is provided with an opening portion to have an inner space portion. The body portion 41 is formed so that four corner portions having a rectangular shape when viewed from the Z direction are notched in a substantially circular-arc shape and is inserted from the opening portion of the body portion 31 into the inner space portion so that the casing body 3 is blocked from below. The body portion 41 includes a storage surface 41a and a side wall 41b. The storage surface 41a is a top surface of the body portion 41. The side wall 41b extends in the Z2 direction along the outer periphery of the storage surface 41a when viewed from the Z direction. The side wall 41b is provided with a plurality of locking portions 41c. The body portion 41 is inserted into the body portion 31 when the lower cover 4 is assembled to the casing body 3 and the plurality of locking portions 41c are respectively locked to the plurality of locking portions of the body portion 31 to be held by the body portion 31. In the side wall 41b, a notch portion 41d is formed at a position facing the penetration hole 31c when viewed from the Y direction. The notch portion 41d exposes the penetration hole 31c to the outside so that the inner space portion of the body portion 31 and the inner space portion of the body portion 41 communicate with the outside.

The first busbar storage portion 42 is configured to individually store relay terminal connection portions 61a, 62a, 63a, and 64a of the first busbar 6 to be described later. In the first busbar storage portion 42, a storage space portion is formed by a storage wall portion protruding from the storage surface 41a and the relay terminal connection portions 61a, 62a, 63a, and 64a are inserted into the storage space portion. The first busbar storage portions 42 of the embodiment are arranged in the X direction and notches are formed in the same direction as the storage wall portion.

The opening portion 43 penetrates the body portion 41 in the Z direction from the storage surface 41a and is formed in a substantially square shape when viewed from the Z direction. The opening portion 43 is formed in a size in which the concave portion 35 of the casing body 3 can be inserted into the opening portion 43 in the Z1 direction.

The terminal holding portion 44 is configured to hold each of the external terminal connection portions 61b, 62b, 63b, and 64b. In the terminal holding portion 44, a part of the outer periphery continuous to the notch portion 41d in the storage surface 41a is offset inward along the Y direction and protrudes toward the Z2 direction from the offset portion. The end portion of the terminal holding portion 44 in the Z2 direction is provided with a plurality of groove portions 44a respectively corresponding to the external terminal connection portions 61b to 64b. In a state where the external terminal connection portions 61b, 62b, 63b, and 64b are respectively stored in the groove portions 44a of the terminal holding portion 44, the external terminal connection portions 61b to 64b in the Y direction are formed at positions facing the penetration hole 31c.

The electronic component 5 is a component that, for example, the vibration proof structure S is required to interposed between the electronic component accommodation box 1 and the vehicle body side attachment member 100. That is, the electronic component 5 generates a vibration during an operation. As illustrated in FIGS. 1 and 4, the electronic component 5 of the embodiment corresponds to high voltage relays 5A and 5B which control high-voltage power input from, for example, a power supply such as a battery by turning on or off a switch provided therein and outputting the high-voltage power to various electronic devices outside the electronic component 5. The high voltage relays 5A and 5B are formed in a substantially rectangular parallelepiped shape and are stored in the relay storage portion 33. Each of the high voltage relays 5A and 5B includes a load input terminal portion 51, a partition plate 52, and a relay terminal (not illustrated).

The load input terminal portion 51 is formed of a conductive metal or the like and inputs power from the outside therein. The load input terminal portion 51 is formed as a pair of load input terminal portions in one of a plurality of surfaces constituting the outer peripheral surfaces of the high voltage relays 5A and 5B. The load input terminal portion 51 includes an insertion hole 51a into which a fastening member (not illustrated) attaching the second busbar 7 to the high voltage relays 5A and 5B while being in contact with the second busbar 7 is inserted. In the insertion hole 51a, the inner peripheral surface is provided with a screw into which the fastening member is threaded.

The partition plate 52 is configured to prevent the contact of two of the second busbars 71 to 74 attached to one of the high voltage relays 5A and 5B. The partition plate 52 is formed of an insulating synthetic resin or the like and protrudes from the outer peripheral surface between the pair of load input terminal portions 51. The partition plate 52 can prevent a short circuit while being interposed between two second busbars 71 to 74.

The relay terminal is used to supply power which is controlled by switches inside the high voltage relays 5A and 5B to various electronic devices outside the electronic component accommodation box 1. A plurality of the relay terminals protrude from a surface facing the storage surface 31a among the plurality of surfaces constituting the outer peripheral surfaces of the high voltage relays 5A and 5B and extend in the Z1 direction. The relay terminals penetrate the relay terminal penetration holes provided in the relay storage portion 33 and are respectively electrically connected to the relay terminal connection portions 61a, 62a, 63a, and 64a.

As illustrated in FIG. 4, the first busbar 6 is stored between the casing body 3 and the lower cover 4 and is configured to electrically connect various electronic devices outside the electronic component accommodation box 1 to the electronic component 5. The first busbar 6 includes a plurality of busbars, that is, first busbars 61, 62, 63, and 64 in the embodiment. The first busbars 61 to 64 are formed of conductive metal and are each formed in a flat plate shape. One end portions of the first busbars 61 to 64 are respectively provided with the relay terminal connection portions 61a, 62a, 63a, and 64a bent at right angles toward the Z2 direction. The relay terminal connection portions 61a to 64a are respectively stored in the first busbar storage portions 42. The other end portions of the first busbars 61 to 64 are respectively provided with the external terminal connection portions 61b, 62b, 63b, and 64b which extend while being bent at right angles toward the Z2 direction and are bent at right angles in the Y direction. The external terminal connection portions 61b to 64b are exposed to the outside through the penetration holes 31c while being respectively stored in the groove portions 44a and are electrically connected to connection terminals or the like connected to various external electronic devices.

As illustrated in FIGS. 1 and 4, the second busbar 7 is stored between the casing body 3 and the upper cover and is used to electrically connect a power supply such as a battery to the high voltage relays 5A and 5B. The second busbar 7 includes a plurality of busbars, that is, second busbars 71, 72, 73, and 74 in the embodiment. Each of the second busbars 71 to 74 is formed of a conductive metal to have a flat plate shape and has a bent portion which is bent at right angles when viewed from the Z direction. One end portions of the second busbars 71 to 74 respectively electrically come in contact with the load input terminal portions 51 and penetration holes 71a, 72a, 73a, and 74a are respectively formed at positions facing the insertion holes 51a. The other end portions of the second busbars 71 to 74 are provided with foot portions 71b, 72b, 73b, and 74b which are bent while forming right angles with respect to the Z direction. The foot portion 71b to 74b are electrically connected to connection terminals or the like connected to a power supply such as a battery while being respectively stored in the second busbar storage portions 34.

The vibration damping unit 8 constitutes a part of the vibration proof structure S. The vibration damping unit 8 is configured to suppress a vibration during the operation of the electronic component 5 from being transmitted to the vehicle body side attachment member 100 through the casing 2. The vibration damping unit 8 includes the elastic vibration proof member (rubber mount) 81, a collar member 82, and a fastening member 83.

The vibration proof member 81 is attached to the casing 2 and is inserted into the fixed pin 101 to support the load of the casing 2 with respect to the vehicle body side attachment member 100. The vibration proof member 81 of the embodiment is, for example, the rubber mount and is formed in a cylindrical shape. The vibration proof member 81 is inserted into the claw portion 32 of the casing body 3 and one end portion in the axial direction, that is, the end portion in the Z1 direction comes in contact with the casing installation surface 100a of the vehicle body side attachment member 100. The vibration proof member 81 includes a penetration hole 81a and a groove portion 81b. The penetration hole 81a is configured to insert the collar member 82 thereinto. The groove portion 81b is inserted into the notch portion 32a of the claw portion 32 and is formed to be recessed inward in the entire periphery of the outer peripheral surface around the axial direction of the vibration proof member 81.

The collar member 82 is inserted into the penetration hole 81a of the vibration proof member 81 and is inserted into the fixed pin 101 to be interposed between the vibration proof member 81 and the fixed pin 101. Accordingly, the collar member serves as a spacer with respect to the vibration proof member 81. The collar member 82 is formed of a material such as synthetic resin which is not easily deformed by a load compared to the vibration proof member 81 and includes a body portion 82a, a flange portion 82b, and a penetration hole 82c. The body portion 82a is formed in a cylindrical shape and is formed so that an axial length is the same (substantially the same) as an axial length of the vibration proof member 81. The flange portion 82b is used to prevent the separation of the vibration proof member 81 in the axial direction and is formed to protrude outward in the radial direction at the end portion in the Z2 direction in the outer peripheral surface around the axial direction of the body portion 82a. The penetration hole 82c penetrates the body portion 82a at both end portions in the axial direction and is configured to insert the fixed pin 101 thereinto.

The fastening member 83 is configured to hold the vibration proof member 81 and the collar member 82 inserted to the fixed pin 101 against the vehicle body side attachment member 100. The fastening member 83 is, for example, a flanged nut. The fastening member 83 is threaded onto the fixed pin 101 and comes in contact with the flange portion 82b.

Here, the vibration proof structure S of the embodiment includes the fixed pin 101, the claw portion 32, and the vibration damping unit 8 as described above and is provided between the casing 2 and the vehicle body side attachment member 100.

The damping member 9 is interposed between the sliding holes 36 and 37 and the sliding pins 102 and 103 and is configured to generate sliding resistance between each of the sliding holes 36 and 37 and each of the sliding pins 102 and 103 when the casing 2 moves relatively to the vehicle body side attachment member 100. The damping member 9 is, for example, an elastic rubber damper and includes a first rubber damper 91 and a second rubber damper 92.

The first rubber damper 91 and the second rubber damper 92 are respectively formed in elongated annular shapes including penetration holes 91a and 92a and are respectively attached to the inner peripheral surface of the first sliding hole 36 and the inner peripheral surface of the second sliding hole 37. The first rubber damper 91 is used to generate sliding resistance between the first sliding hole 36 and the first sliding pin 102 when the casing 2 moves relative to the vehicle body side attachment member 100. The second rubber damper 92 is configured to generate sliding resistance between the second sliding hole 37 and the second sliding pin 103 when the casing 2 moves relative to the vehicle body side attachment member 100. Both end portions of the rubber dampers 91 and 92 in the Z direction respectively protrude from the outer peripheral surfaces of the rubber dampers 91 and 92 and are respectively provided with edge portions 91b and 92b which extend toward the outside of the rubber dampers 91 and 92 so as to be larger than the sliding holes 36 and 37. In each of the rubber dampers 91 and 92, the inner peripheral surface is inclined inward in the radial direction from the Z1 direction and the Z2 direction when viewed from the Y direction. Thus, the penetration holes 91a and 92a are configured to narrow as it goes toward the apex of the gradient and the widths of the elongated hole shapes of the penetration holes 91a and 92a in the short direction are narrower than the diameters of the sliding pins 102 and 103.

With the above-described configuration, the damping structure R of the embodiment is different from the vibration proof structure S and includes a set of damping structures R including the first sliding hole 36, the first sliding pin 102, and the first rubber damper 91 and corresponding to the Y direction and a set of damping structures R including the second sliding hole 37, the second sliding pin 103, and the second rubber damper 92 and corresponding to the X direction and is provided between the casing 2 and the vehicle body side attachment member 100.

Next, an example of a procedure of attaching the electronic component accommodation box 1 to the vehicle body side attachment member 100 will be described. First, an operator attaches the first rubber damper 91 to the first sliding hole 36 by press-inserting and attaches the second rubber damper 92 to the second sliding hole 37 by press-inserting. Next, the operator holds the lower cover 4 by the casing body 3 while storing the first busbar 6 in the lower cover 4. Next, the operator holds the upper cover by the casing body 3 while storing the high voltage relays 5A and 5B and the second busbar 7 in the casing body 3. Accordingly, the electronic component accommodation box 1 is assembled. Next, the operator inserts the body portion 82a of the collar member 82 into the penetration hole 81a of the rubber mount 81. Next, the operator inserts the rubber mount 81 having the collar member 82 attached thereto into the notch portion 32a of the claw portion 32 and inserts the claw portion 32 into the groove portion 81b of the rubber mount 81 to attach the rubber mount 81 to the claw portion 32. Next, the operator allows the penetration holes 82c of the collar members 82 to face the fixed pins 101 in the Z direction. Next, the operator moves the casing 2 relative to the vehicle body side attachment member 100 in the Z1 direction so that each fixed pin 101 is inserted into each penetration hole 82c in the Z1 direction. Next, the operator further moves the casing 2 relative to the vehicle body side attachment member 100 in the Z1 direction so that the first sliding pin 102 is inserted into the penetration hole 91a of the first rubber damper 91 and the second sliding pin 103 is inserted into the penetration hole 92a of the second rubber damper 92. At this time, the first sliding pin 102 and the second sliding pin 103 respectively elastically compress the first rubber damper 91 and the second rubber damper 92 to be slidably press-inserted into the first rubber damper 91 and the second rubber damper 92. Next, the operator threads each fastening member 83 onto each fixed pin 101 while the end portions of the rubber mount 81 and the collar member 82 in the Z1 direction come in contact with the casing installation surface 100a and the casing 2 is separated with respect to the vehicle body side attachment member 100 so that the rubber mount 81 and the collar member 82 inserted to the fixed pin 101 are held against the vehicle body side attachment member 100. Accordingly, the casing 2 is attached to the vehicle body side attachment member 100.

Next, a function of the attachment structure T of the electronic component accommodation box 1 will be described. First, the vibration proof structure S will be described. The high voltage relays 5A and 5B are operated in response to the vehicle state. When the high voltage relays 5A and 5B are operated, a vibration is generated and is transmitted to the casing 2. The vibration transmitted to the casing 2 is transmitted to the vehicle body side attachment member 100 through the vibration proof structure S. At this time, since the elastic rubber mount 81 supports the load of the electronic component accommodation box 1, the vibration is transmitted from the claw portion 32 of the casing body 3 to the rubber mount 81, but since the original frequency of the casing 2 including the vibration damping unit 8 decreases, the vibration which is transmitted to the vehicle body side attachment member 100 through the rubber mount 81 becomes smaller than the vibration of the electronic component 5. Thus, it is possible to suppress the vibration from being transmitted from the casing 2 to the vehicle body side attachment member 100 by the vibration proof structure S.

Next, the damping structure R will be described. For example, a vibration occurs in the vehicle body side attachment member 100 due to an unevenness of a road when the vehicle travels. Here, the load of the casing 2 is supported by the vehicle body side attachment member 100 through the vibration proof structure S and the casing 2 and the vehicle body side attachment member 100 are in different systems. Thus, when the vehicle body side attachment member 100 is vibrated, the casing 2 starts to be vibrated in a resonance state while having a phase difference in accordance with the vibration. That is, the casing 2 moves relative to the vehicle body side attachment member 100. For example, when the casing 2 moves relative to the vehicle body side attachment member 100 in the X direction, the second sliding hole 37 slides on the second sliding pin 103 in the elongated hole direction. For example, when the casing 2 moves relative to the vehicle body side attachment member 100 in the Y direction, the first sliding hole 36 slides on the first sliding pin 102 in the elongated hole direction. For example, when the casing 2 moves relative to the vehicle body side attachment member 100 in the Z direction, the first sliding hole 36 and the second sliding hole 37 slide on the first sliding pin 102 and the second sliding pin 103 in the axial direction of the hole. That is, since the outer peripheral surface 102a of the first sliding pin 102 and the outer peripheral surface 103a of the second sliding pin 103 move relatively while being contact with the first rubber damper 91 and the second rubber damper 92 in any direction during the relative movement, the sliding resistance is generated. The friction energy which is generated by the sliding resistance is obtained such that a part of the kinetic energy of the relatively moving casing 2 is converted into heat energy due to the sliding resistance. Thus, the kinetic energy decreases by a degree in which the kinetic energy is converted into the heat energy. Accordingly, since the kinetic energy decreases, the vibration of the casing 2 is reduced.

As described above, in the embodiment, the damping structure R which is different from the vibration proof structure S is provided between the casing 2 and the vehicle body side attachment member 100. The damping member 9 (the first rubber damper 91, the second rubber damper 92) of the damping structure R is attached to the casing 2 and is interposed between the first sliding portion (the first sliding hole 36 and the second sliding hole 37) and the second sliding portion (the first sliding pin 102 and the second sliding pin 103) to generate the sliding resistance. It is possible to reduce the kinetic energy of the relatively moving casing 2 due to the friction energy caused by the sliding resistance. Thus, since the vibration proof member 81 is attached to the casing 2, the original frequency of the casing 2 decreases. Thus, even in the case of a value which is substantially equal to the vibration frequency when the vehicle body side attachment member 100 is vibrated, it is possible to lower the resonance magnification which is the transmission rate of the vibration in the vicinity of the resonance point at the time of resonance and the amplitude and the acceleration of the vibration. Accordingly, it is possible to reduce the vibration. That is, the attachment structure T of the electronic component accommodation box 1 of the embodiment can reduce the relative movement amount compared to the conventional attachment structure for an electronic component accommodation box. Accordingly, even when the electronic component accommodation box 1 moves relative to the vehicle body side attachment member 100 due to the vibration proof structure S, it is possible to suppress a bad influence on the electronic component 5 mounted in the electronic component accommodation box 1.

Further, in the embodiment, the first sliding pin 102 and the second sliding pin 103 are respectively inserted into the first sliding hole 36 and the second sliding hole 37 to be attached thereto while the fixed pins 101 are respectively inserted into the penetration holes 82c when the casing 2 is attached to the vehicle body side attachment member 100. Thus, since the misalignment in the X direction and the Y direction relative to the predetermined attachment position of the casing 2 caused by the molding tolerance of each of members such as the casing 2 or a variation in attachment position of the rubber mount 81 with respect to the casing 2 when each fixed pin 101 is inserted into each penetration hole 82c is suppressed by respectively inserting the first sliding pin 102 and the second sliding pin 103 into the first sliding hole 36 and the second sliding hole 37, the casing 2 can be attached while being positioned to the attachment position. Accordingly, the operator can reliably and easily attach the casing 2 to the vehicle body side attachment member 100.

Further, in the damping structure R of the embodiment, the first sliding pin 102 which extends in the Z direction is inserted into the first sliding hole 36 formed in the Y direction and the second sliding pin 103 is inserted into the second sliding hole 37 formed in the X direction. Accordingly, even when a relative movement occurs in any one of the X, Y, and Z directions, the first sliding pin 102 and the second sliding pin 103 can be reliably brought into contact with the damping member 9 to generate the sliding resistance. Further, for example, even when the casing 2 is attached obliquely due to the condition of the vehicle interior space, the damping structure R corresponds to the three-dimensional directions which are orthogonal to each other in the casing 2. For this reason, since the sliding resistance can be generated in any direction, it is possible to suppress a bad influence on the electronic component 5 mounted in the electronic component accommodation box 1 regardless of the attachment state of the casing 2.

In the embodiment, the first sliding hole 36 and the second sliding hole 37 are formed in an elongated hole shape, but the embodiment is not limited thereto. The first sliding pin 102 and the second sliding pin 103 may be formed in, for example, a circular shape or an oval shape as long as the sliding resistance can be generated.

In the embodiment, it is assumed that the electronic component accommodation box 1 has the vibration proof structure S because the electronic component 5 generates a vibration. However, the electronic component accommodation box 1 may require the vibration proof structure S for other reasons regardless of the vibration generated in the electronic component 5.

The attachment structure for an electronic component accommodation box according to the embodiment includes the damping structure which is different from the vibration proof structure and is provided between the casing and the vehicle body side attachment member. Since the damping member of the damping structure generates sliding resistance between the first sliding portion and the second sliding portion when the casing moves relative to the vehicle body side attachment member, it is possible to reduce a relative movement amount of the casing relative to the vehicle body side attachment member. Accordingly, there is an advantageous effect that a bad influence on the electronic component mounted in the electronic component accommodation box can be suppressed.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An attachment structure for an electronic component accommodation box comprising:
   a casing of an electronic component accommodation box in which at least one electronic component is mounted;
   a vehicle body side attachment member on which the casing is provided;
   a vibration proof structure provided between the casing and the vehicle body side attachment member; and
   a damping structure provided between the casing and the vehicle body side attachment member and different from the vibration proof structure, wherein
   the vibration proof structure includes an elastic vibration proof member,
   the vibration proof member is attached to the casing and supports a load of the casing with respect to the vehicle body side attachment member,
   the damping structure includes a first sliding portion, a second sliding portion, and a damping member interposed between the first sliding portion and the second sliding portion, and
   the damping member generates sliding resistance between the first sliding portion and the second sliding portion when the casing moves relative to the vehicle body side attachment member and causes the first sliding portion to slide on the second sliding portion.

2. An attachment structure for an electronic component accommodation box comprising:
   a casing of an electronic component accommodation box in which at least one electronic component is mounted;
   a vehicle body side attachment member on which the casing is provided;
   a vibration proof structure provided between the casing and the vehicle body side attachment member; and
   a damping structure provided between the casing and the vehicle body side attachment member and different from the vibration proof structure, wherein the vibration proof structure includes an elastic vibration proof member, the vibration proof member is attached to the casing and supports a load of the casing with respect to the vehicle body side attachment member, the damping structure includes a first sliding portion, a second sliding portion, and a damping member interposed between the first sliding portion and the second sliding portion, and the damping member generates sliding resistance between the first sliding portion and the second sliding portion when the casing moves relative to the vehicle body side attachment member, the first sliding portion is a sliding hole, the second sliding portion is a sliding pin, the damping member is attached along an inner peripheral surface of the sliding hole, the sliding pin is inserted into the sliding hole provided with the damping member, and an outer peripheral surface of the sliding pin comes in contact with the damping member to generate sliding resistance during the relative movement.

3. An attachment structure for an electronic component accommodation box comprising:

a casing of an electronic component accommodation box in which at least one electronic component is mounted;

a vehicle body side attachment member on which the casing is provided;

a vibration proof structure provided between the casing and the vehicle body side attachment member; and a damping structure provided between the casing and the vehicle body side attachment member and different from the vibration proof structure, wherein the vibration proof structure includes an elastic vibration proof member, the vibration proof member is attached to the casing and supports a load of the casing with respect to the vehicle body side attachment member, the damping structure includes a first sliding portion, a second sliding portion, and a damping member interposed between the first sliding portion and the second sliding portion, and the damping member generates sliding resistance between the first sliding portion and the second sliding portion when the casing moves relative to the vehicle body side attachment member, the vibration proof member is a rubber mount, and the damping member is an elastic rubber damper.

4. The attachment structure for an electronic component accommodation box according to claim 2, wherein the damping member is an elastic rubber damper.

* * * * *